United States Patent
Kobayashi (10) Patent No.: US 8,503,214 B2
(45) Date of Patent: Aug. 6, 2013

(54) SEMICONDUCTOR MEMORY DEVICE

(75) Inventor: Yasuo Kobayashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 217 days.

(21) Appl. No.: 13/034,901

(22) Filed: Feb. 25, 2011

(65) Prior Publication Data

US 2011/0235387 A1 Sep. 29, 2011

(30) Foreign Application Priority Data

Mar. 25, 2010 (JP) ................................. 2010-069266

(51) Int. Cl.
*G11C 17/00* (2006.01)

(52) U.S. Cl.
USPC .................... 365/94; 365/185.13; 365/185.11; 365/230.03

(58) Field of Classification Search
USPC ...................... 365/185.13, 185.11, 94, 230.03
See application file for complete search history.

(56) References Cited

U.S. PATENT DOCUMENTS

| | | | |
|---|---|---|---|
| 6,618,287 B2 * | 9/2003 | Elmhurst | 365/185.11 |
| 8,134,861 B2 * | 3/2012 | Nakadai | 365/154 |
| 2003/0112662 A1 * | 6/2003 | Tanzawa et al. | 365/185.11 |
| 2007/0195574 A1 * | 8/2007 | Mabuchi | 365/94 |
| 2009/0122600 A1 * | 5/2009 | Choi et al. | 365/163 |
| 2009/0180306 A1 | 7/2009 | Terada et al. | |

FOREIGN PATENT DOCUMENTS

JP 2009-170641 A 7/2009

* cited by examiner

*Primary Examiner* — Vu Le
*Assistant Examiner* — Han Yang
(74) *Attorney, Agent, or Firm* — Sughrue Mion, PLLC (57) ABSTRACT

A semiconductor memory device provided with a new bit line hierarchization method that enables further reduction of power consumption is provided. The semiconductor memory device includes multiple memory blocks provided in a matrix configuration and multiple main bit lines provided in correspondence with the memory blocks. Each of the memory blocks includes: multiple memory cells provided in a matrix configuration; multiple sub bit lines provided on a column-by-column basis; multiple word lines provided with respect to each of columns and rows and common to multiple memory blocks; and a switch circuit that couples a corresponding main bit line to any of the sub bit lines. In the operation of reading a target cell as the target of read, a main bit line corresponding to the target cell is selected, a sub bit line corresponding to the column of the target cell is selected through the switch circuit; and a word line corresponding to the column and the row of the target cell is selected from among the word lines.

9 Claims, 11 Drawing Sheets

FIG. 12

SEMICONDUCTOR MEMORY DEVICE

CROSS-REFERENCE TO RELATED APPLICATIONS

The disclosure of Japanese Patent Application No. 2010-69266 filed on Mar. 25, 2010 including the specification, drawings, and abstract is incorporated herein by reference in its entirety.

BACKGROUND

1. Field of the Invention

The present invention relates to semiconductor memory devices and in particular to a semiconductor memory device with hierarchized bit lines.

2. Description of Related Art

There are known technologies for hierarchizing bit lines to suppress power consumption in a semiconductor memory device. For example, Japanese Unexamined Patent Publication No. 2009-170641 (corresponding US Patent Application Publication No. 2009180306 (A1)) discloses a mask ROM (Read Only Memory) with hierarchized bit lines. With respect to this mask ROM, a method of hierarchizing bit lines and providing main bit lines and sub bit lines has been proposed to reduce the charging/discharging current of bit lines with the aim of reducing power during operation.

Figure 1:
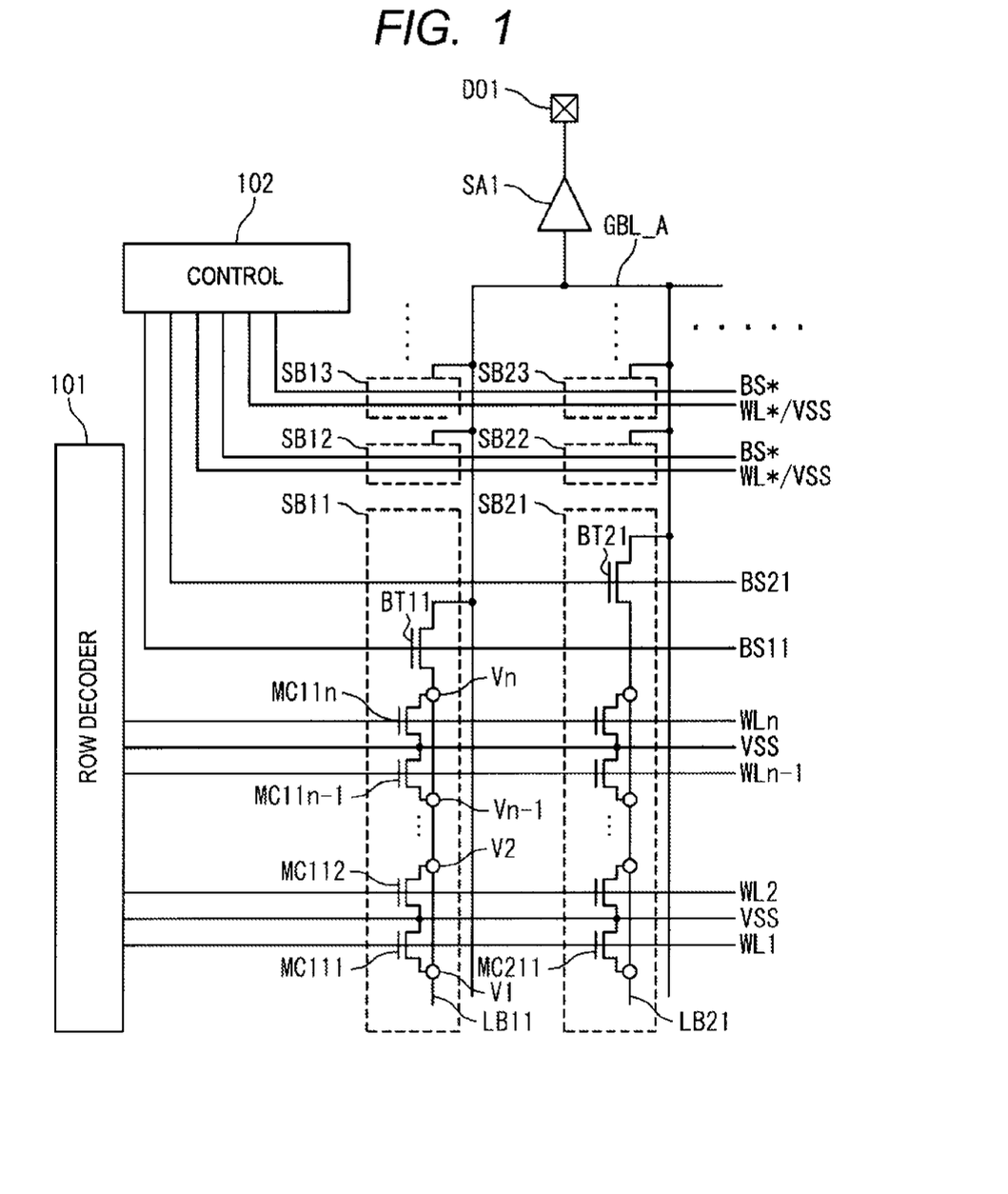
FIG. 1 is a circuit diagram illustrating the configuration of the semiconductor memory device disclosed in Japanese Unexamined Patent Publication No. 2009-170641.

FIG. 1 is a circuit diagram illustrating the configuration of the semiconductor memory device disclosed in Japanese Unexamined Patent Publication No. 2009-170641. This semiconductor memory device is a mask ROM having a hierarchized bit line structure (sub bit lines and main bit lines). This semiconductor memory device includes multiple sub memory arrays SB, multiple sub bit line LB, multiple main bit lines GBL, and coupling circuits BT. Each sub memory array SB is comprised of multiple memory cells MC. The sub bit lines LB are coupled to memory cells MC. Each coupling circuit BT couples together a sub bit line LB and a main bit line GBL. The coupling circuit BT is comprised of at least one pattern in the same shape as that of each the memory cell MC.

As an example, it will be assumed that in this semiconductor memory device, one word line WL1 is selected by a row decoder 101 in read operation. Consequently, the memory cell MC111 in the sub memory array SB11 coupled to this word line WL1 and the memory cell MC211 in the sub memory array SB21 on the immediate right to the memory cell MC111. As a result, data in each memory cell MC is read to the sub bit lines LB11, LB21. When a switch transistor BT11 is thereafter selected, data on the sub bit line LB11 is transmitted to a main bit line GBL_A. Meanwhile, since a switch transistor BT21 is not selected, data read to the sub bit line LB21 is not used.

SUMMARY

As mentioned above, for example, the following processing is carried out in the semiconductor memory device in Japanese Unexamined Patent Publication No. 2009-170641 in read operation: when one word line WL1 is selected by the row decoder 101, the sub bit lines LB11, LB21, . . . coupled to this word line WL1 are selected. That is, when the word line WL1 is selected (brought to a high level), the memory cell MC111 and the memory cells MC211, . . . lined on the right side thereof are all selected. As a result, pieces of data in the selected memory cells MC111, MC211, . . . are respectively read to the sub bit lines LB11, LB21, . . . . If all the pieces of data in the memory cells MC111, MC211, . . . are zero (via V1 is present), the potentials of the sub bit lines LB11, LB21, . . . are all reduced when the word line WL1 is selected (at the time of read). For this reason, a charging current is passed through all of the sub bit lines LB11, LB21, . . . at the time of precharge after read. In case where the memory cell as the target of read is the memory cell MC111, only the switch transistor BT11 of the switch transistors is brought into conduction. Then data in the memory cell MC111 (read data on the sub bit line LB11) is transmitted to the main bit line GBL_A and the data is read. Meanwhile, data read from the memory cells MC211, . . . lined on the right side of the memory cell MC111 to the sub bit lines LB21, . . . is not used. That is, at the sub bit lines LB21, . . . , potential is reduced even through there is not a memory cell as the target of read and thus a charging current is passed therethrough during precharge after read. That is, a charging current for sub bit lines without memory cells as the targets of read is an extra current.

Hereafter, description will be given to means for addressing the problem using numerals and codes used in the description of modes for carrying out the invention. These numerals and codes are parenthesized and added to clarify the correspondence between the description in "What is claimed is" and the modes for carrying out the invention. However, these numerals or codes should not be used to construe the technical scope of the invention described in "What is claimed is."

The semiconductor memory device according to an aspect of the invention includes: multiple memory blocks (B11, B12, . . . ) provided in a matrix configuration and multiple main bit lines (GL1, GL2, . . . ) provided in correspondence with the memory blocks (B11, B12, . . . ). Each (B11) of the memory blocks includes: multiple memory cells (C1, C2, C3, C4, . . . ) provided in a matrix configuration; multiple sub bit lines (BL11, BL12) on a column-by-column basis; multiple word lines (WL11, WL12, . . . ) provided with respect to each of the columns and rows thereof and common to the memory blocks (B11, B12, . . . ); and a switch circuit (SC1) that couples a corresponding main bit line (GL1) of the main bits line (GL1, GL2, . . . ) to either of the sub bit lines (BL11, BL12). In the operation of reading a target cell (C1) as the target of read of the memory cells (C1, C2, C3, C4), a main bit line (GL1) corresponding to this target cell (C1) is selected. A sub bit line (BL11) corresponding to the column of the target cell (C1) is selected by the switch circuit (SC1). Of the word lines (WL11, WL12, . . . ), a word line (WL11) corresponding to the column and row of the target cell (C1) is selected.

In the invention, the word lines (WL11, WL12, . . . ) are provided with respect to each of the columns and rows of the memory cells (C1, C2, C3, C4). For this reason, the following can be implemented: the word lines (WL11, WL12, . . . ) are shared among the memory blocks (B11, B12, . . . ) to suppress increase in circuit area; and at the same time, in an identical memory block (B11), only the sub bit line (BL11) coupled to the target cell (C1) is selected from among the sub bit lines (BL11, BL12) provided on a column-by-column basis. Consequently, data is read only to the selected sub bit line (BL11) and data is not read to the other sub bit line (BL12). As a result, there is no possibility that the potential of the other sub bit line (BL12) is reduced and an extra charging current can be reduced.

In the method of operation of the semiconductor memory device according to another aspect of the invention, the semiconductor memory device includes: multiple memory blocks (B11, B12, . . . ) provided in a matrix configuration and multiple main bit lines (GL1, GL2, . . . ) provided in correspondence with the memory blocks (B11, B12, . . . ). Each (B11) of the memory blocks includes: multiple memory cells (C1, . . . ) provided in a matrix configuration; multiple sub bit lines (BL11, BL12) provided on a column-by-column basis; multiple word lines (WL11, WL12, . . . ) provided with respect to each of the columns and rows thereof and common to the memory blocks (B11, B12, . . . ); and a switch circuit (SC1) that couples a corresponding main bit line (GL1) of the main bit lines (GL1, GL2, . . . ) to either of the sub bit lines (BL11, BL12).

The method of operation of this semiconductor memory device includes the steps of: in the operation of reading a target cell (C1) as the target of read of the memory cells (C1, . . . ), selecting a main bit line (GL1) corresponding to this target cell (C1); selecting a sub bit line (BL1) corresponding to the column of this target cell (C1) by the switch circuit (SC1); and selecting a word line (WL1) corresponding to the column and row of the target cell (C1) of the word lines (WL11, WL12, . . . ).

Also in this case, the same action and effect as described above in relation to the semiconductor memory device of the invention can be obtained.

According to the invention, a semiconductor memory device provided with a new bit line hierarchization method that enables further reduction of power consumption can be provided.

DETAILED DESCRIPTION OF THE PREFERRED EMBODIMENTS

Hereafter, description will be given to semiconductor memory devices in embodiments of the invention with reference to the accompanying drawings. In the following description of each embodiment, a mask ROM having a predetermined configuration will be taken as examples of the semiconductor memory devices.

First Embodiment

Description will be given to a semiconductor memory device in the first embodiment of the invention.

Figure 2:
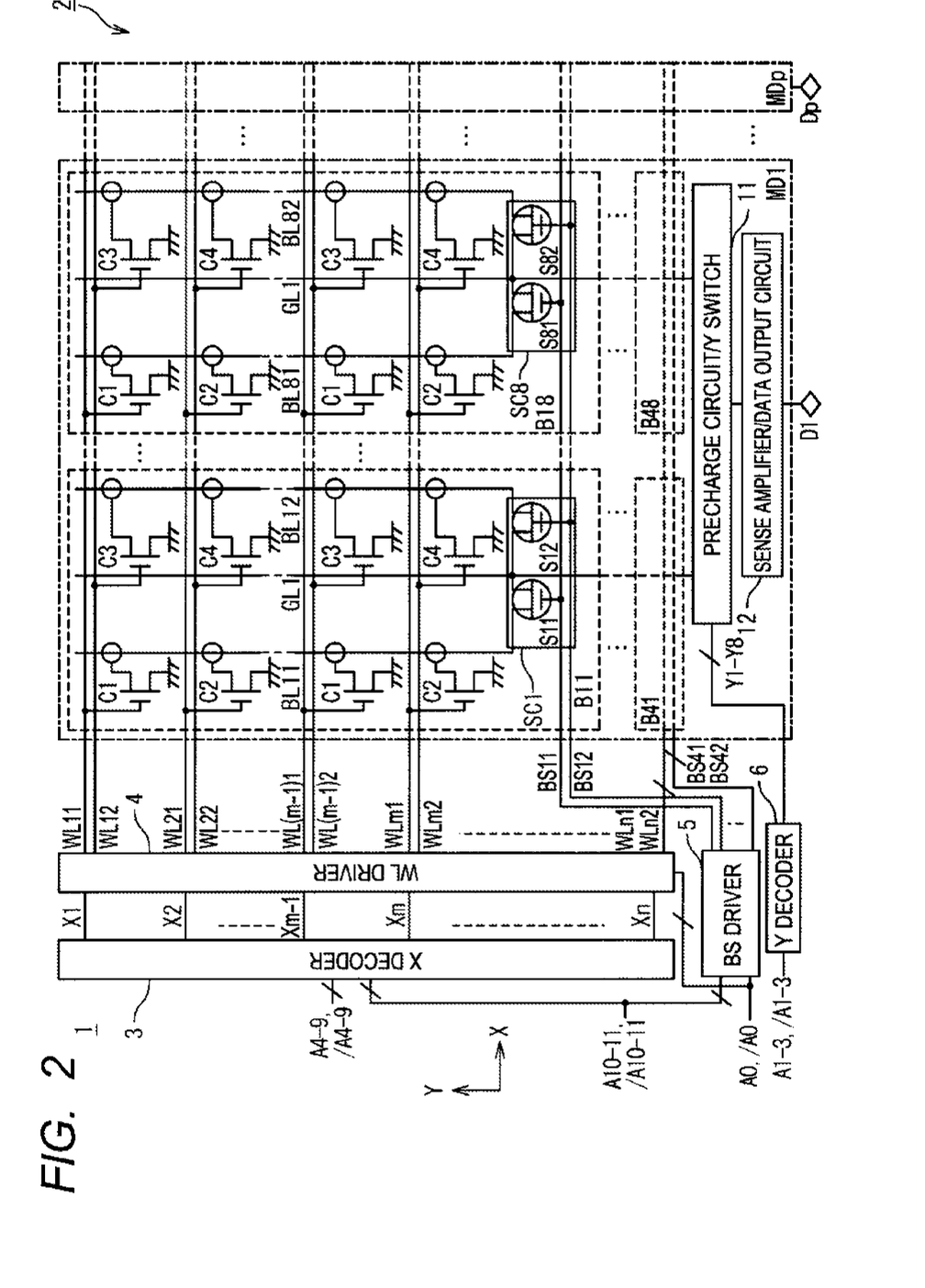
FIG. 2 is a block diagram illustrating the configuration of a semiconductor memory device in first and second embodiments of the invention.

First, description will be given to the configuration of the semiconductor memory device in the first embodiment of the invention. FIG. 2 is a block diagram illustrating the configuration of the semiconductor memory device in the first embodiment of the invention. This semiconductor memory device 1 includes a memory array 2, an X decoder 3, a WL driver 4, a BS driver 5, and a Y decoder 6.

The memory array 2 includes multiple main memory blocks MD1 to MDp adjoining to one another in the Y direction. The main memory blocks MD1 to MDp correspond to outputs D1 to Dp. For example, read data of the main memory block MD1 is outputted from the output D1. Each of the main memory blocks MD1 to MDp includes multiple memory blocks B, multiple main bit lines GL, a precharge circuit/Y switch 11, and a sense amplifier/data output circuit 12.

The memory blocks B are provided in a matrix configuration. This drawing shows an example in which they are provided in a matrix with four rows and eight columns, that is, the memory blocks B11, B12, . . . , B18, B21, . . . , B28, . . . , B41, . . . , B48 are provided. However, the invention is not limited to this example. The individual memory blocks B are identical in configuration. The details thereof will be described later.

The multiple main bit lines GL are extended in the Y direction and their one ends are coupled to the precharge circuit/Y switch 11. This drawing illustrates an example in which multiple main bit lines equivalent to eight columns, that is, the main bit lines GL1, . . . , GL8 are provided. The main bit lines GL are provided in correspondence with the columns of the multiple memory blocks B. For example, the main bit line GL1 corresponds to the memory blocks B11, B21, B31, B41 in the first column of the memory blocks and outputs output from these memory blocks B to the precharge circuit/Y switch 11. However, the invention is not limited to this example.

In read operation, the precharge circuit/Y switch 11 precharges all the main bit lines GL through a precharge circuit (not shown). In read operation, the precharge circuit/Y switch 11 further performs the following operation: it selects a main bit line GL corresponding to a memory block B to which a memory cell C as the target of read belongs through a Y switch (not shown) based on Y address signals Y1 to Y8 from the Y decoder 6; and then it couples the main bit line to the sense amplifier/data output circuit 12. As an example, it will be assumed that a memory cell C as the target of read belongs to the memory block B11, the precharge circuit/Y switch selects the main bit line GL1 and couples it to the sense amplifier/data output circuit 12.

In read operation, the sense amplifier/data output circuit 12 detects the potential of a coupled main bit line GL through a sense amplifier (not clearly shown). Then it outputs the potential as the output data D of the main memory block MD through a data output circuit (not clearly shown). For example, it detects the potential of the main bit line GL1 and outputs the potential as the output data D1 of the main memory block MD1.

Each of the memory blocks B includes multiple memory cells C, multiple sub bit lines BL, multiple word lines WL, and a switch circuit SC.

The memory cells C are provided in a matrix configuration. In the example in this drawing, they are provided in m rows and two columns. That is, the memory cells C1 (first column), C3 (second column) are provided in the first row and the memory cells C2 (first column), C4 (second column) are provided in the second row. In the third and the following rows, the arrangement in the first row and the second row is repeated. However, the invention is not limited to this example. Each of the memory cells C is, for example, a ROM cell that stores data in a transistor by the presence or absence of wiring (example: via) coupled to its drain. The transistor comprising this ROM cell is, for example, of re-channel type. When coupled, its source, drain, and gate are respectively coupled to ground, a corresponding sub bit line BL, and a corresponding word line WL.

The multiple sub bit lines BL are extended in the Y direction and their one ends are coupled to the switch circuit SC. This drawing illustrates an example in which two sub bit lines, that is, the sub bit lines BL11, BL12 are provided. The sub bit lines BL are provided in correspondence with the columns of the memory cells C (on a column-by-column basis). For example, the sub bit line BL11 of the memory block B11 corresponds to the memory cells C1, C2 in the first column and the sub bit line BL12 corresponds to the memory cells C3, C4 in the second column. However, the invention is not limited to this example.

The multiple word lines WL are extended in the X direction and their one ends are coupled to the WL driver 4. This drawing illustrates an example in which one memory block is provided with (m×2) word lines and one main memory block is provided with (n×2) word lines, that is, the word lines WL11, WL12, WL21, WL22, ..., WLm1, WLm2, ..., WLn1, WLn2 are provided. The word lines WL are provided with respect to each of the columns and rows (in correspondence with the columns and rows) of the memory cells C arrayed in a matrix configuration. For example, the word line WL11 corresponds to the first row and the first column of the memory cells C and the word line WL12 corresponds to the first row and the second column of the memory cells C. The word lines WL are common to multiple memory blocks B lined in the direction of row. For example, the word line WL11 is common to the memory blocks B11, B12, ..., B18. However, the invention is not limited to this example.

Each switch circuit SC selects one sub bit line BL from among multiple sub bit lines BL based on the selection of a sub bit line selection line BS and couples a corresponding main bit line GL to it. In the example in this drawing, a corresponding main bit line GL is coupled to either of two sub bit lines BL based on the selection of a sub bit line selection line BS. Each switch circuit SC includes multiple p-channel transistors S provided in correspondence with multiple sub bit lines BL. Each p-channel transistor S has one end coupled to a main bit line GL and the other end coupled to a sub bit line BL. In the switch circuit SC1, for example, the p-channel transistor S11 is turned on based on the selection of the sub bit line selection line BS11 and the switch circuit SC1 couples the corresponding main bit line GL1 to the sub bit line BL11. Or, the p-channel transistor S12 is turned on based on the selection of the sub bit line selection line BS12 and the switch circuit SC1 couples the corresponding main bit line GL1 to the sub bit line BL12.

The memory cells C are provided in a matrix with m rows and p columns (p=2 in the example in FIG. 2) in each memory block B.

The word lines WL equivalent to p columns are provided in each of the m rows in correspondence with the columns of the memory cells C.

The sub bit lines BL equivalent to p columns are provided. The gate of the memory cell C in the i-th row and k-th column ($1 \leq i \leq m$, $1 \leq k \leq p$, i and k are natural numbers) of the multiple memory cells c is coupled to the word line WLik for the i-th row and the k-th column.

The X decoder 3 selects any of the multiple main word lines X based on address signals A4-A9, /A4-/A9, A10-A11, /A10-/A11. That is, the X decoder 3 selects the following from among the multiple rows (m rows) of the memory cells C in a memory block B to which the target cell belongs: the row (i-th row) of the memory cell C as the target of read (hereafter, also referred to as "target cell"). However, the address signals A10-A11, /A10-/A11 are address signals indicating the row of a memory block B to which the target cell belongs. The address signals A4-A9, /A4-/A9 are signals indicating the row of the target cell in that memory block B. As an example, it will be assumed that the target cell is the memory cell C3 in the first row and the second column of the memory block B11. In this case, the main word line X1 is selected from among the main word lines X1 to Xm corresponding to the memory block B11.

The multiple main word lines X are extended in the X direction and have their one ends coupled to the X decoder 3 and their other ends coupled to the WL driver 4. In the example in this example, m main word line are provided, that is, the main word lines X1, X2, ..., Xm, ..., Xn are provided. The main word lines X are provided with respect to each of the rows (in correspondence with the rows) of the memory cells C arrayed in a matrix configuration. For example, the main word line X1 corresponds to the first row of the memory cells C. The main word lines X correspond to sets of the word lines WL. For example, the main word line X1 corresponds to the word lines WL11, WL12, or the set of the word lines WL1.

The WL driver 4 selects the following based on a main word line X selected from among multiple main word lines X and the address signals A0, /A0: it selects either word line WL belonging to the set of word lines WL corresponding to the selected main word line X. However, the address signals A0, /A0 are signals indicating the column of the target cell in a memory block B. As an example, it will be assumed that the target cell is the memory cell C3 in the first row and the second column in the memory block B11. In this case, the main word line X1 selected at the X decoder 3 is selected and the word line WL12 is selected from the set of the word line WL11 and the word line WL12 based on the address signals A0, /A0.

Figure 3:
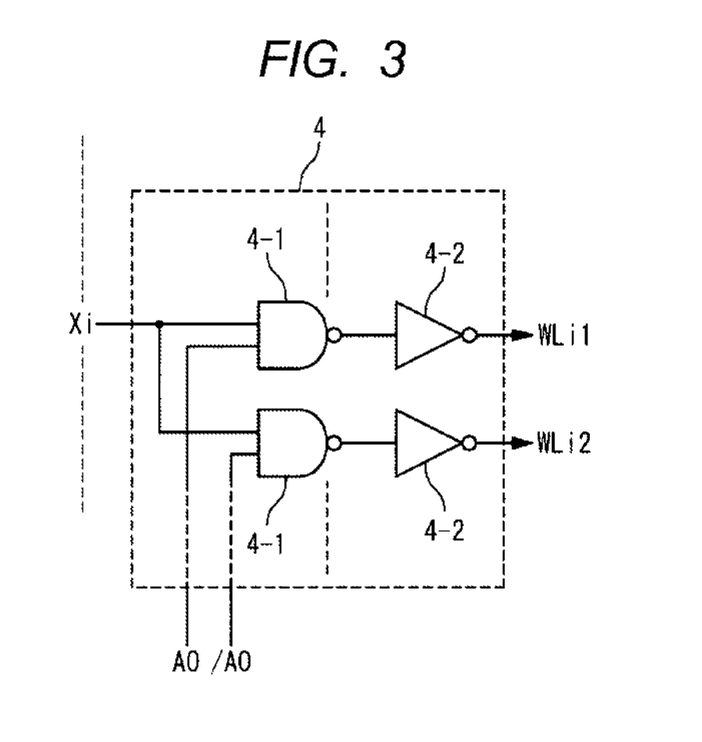
FIG. 3 is a circuit diagram illustrating an example of the configuration of a WL decoder of a semiconductor memory device in an embodiment of the invention.

FIG. 3 is a circuit diagram illustrating an example of the configuration of the WL driver 4 and shows the portion corresponding to the i-th row of the memory cells C. When the main word line Xi is selected, the WL driver 4 selects either of the word line WLi1, WLi2 belonging to a set of word lines WL based on the address signals A0, /A0. The WL driver 4 includes a NAND circuit 4-1 and an inverter circuit 4-2 coupled in series. The output of the NAND circuit 4-1 is coupled to the input of the inverter circuit 4-2. There are NAND circuits 4-1 and inverter circuits 4-2 in the same number of word lines WL as those belonging to one set. In the example in FIG. 2 and FIG. 3, there are two word lines WLi1, WLi2 in one set of word lines WL; therefore, two NAND circuits 4-1 and two inverter circuits 4-2 are provided. The input of each NAND circuit 4-1 is either the main word line Xi or the address signals A0, /A0. The output of each inverter circuit 4-2 is coupled to a word line WL (example: WL11, WL12).

As an example, it will be assumed that the main word line Xi is selected and brought to a high level, the address signal A0 is brought to a high level, and the address signal /A0 is brought to a low level. In this case, the word line WLi1 is selected and brought to a high level. Meanwhile, the word line WLi2 is not selected and brought to a low level. As another example, it will be assumed that the main word line Xi is selected and brought to a high level, the address signal A0 is brought to a low level, and the address signal /A0 is brought to a high level. In this case, the word line WLi2 is selected and brought to a high level. Meanwhile, the word line WLi1 is not selected and brought to a low level.

The BS driver 5 performs the following operation based on the address signals A10-A11, /A10-/A11, A0, /A0: it selects a sub bit line selection line BS corresponding to the memory block B and the sub bit line BL of the target cell from among multiple sub bit line selection lines BS11, BS12, BS21, . . . , BS41, BS42. As an example, it will be assumed that the target cell is the memory cell C3 in the first row of the memory block B11. In this case, the BS driver 5 selects the sub bit line selection line BS12 corresponding to the memory block B11 and the sub bit line BL12 based on the address signals A10-A11, /A10-/A11, A0, /A0.

The multiple sub bit line selection lines BS couple together the BS driver 5 and the switch circuit SC of each memory block B. In the example in this drawing, 4×2 sub bit line selection lines are provided, that is, the sub bit line selection lines BS11, BS12, BS21, . . . , BS41, BS42 are provided. The sub bit line selection lines are provided in correspondence with the following: the rows of multiple memory block B arrayed in a matrix configuration and (the number of) the columns of the sub bit lines in each memory block B. For example, the sub bit line selection line BS12 corresponds to the first row (B11, B12, . . . , B18) of the memory blocks B and the second columns (BL12, BL22, . . . , BL82) of the sub bit lines.

The Y decoder 6 outputs any of main bit line selection signals Y for selecting any of multiple main bit lines GL to the precharge circuit/Y switch 11 based on the address signals A1-A3, /A1-/A3. When the main bit line GL1 is selected from among main bit lines GL1 to GL8 in the example in this drawing, the Y decoder 6 outputs the main bit line selection signal Y1. However, the address signals A1-A3, /A1-/A3 indicate the column of the memory block B (or the column of the main bit line) to which the target cell belongs.

Figure 4:
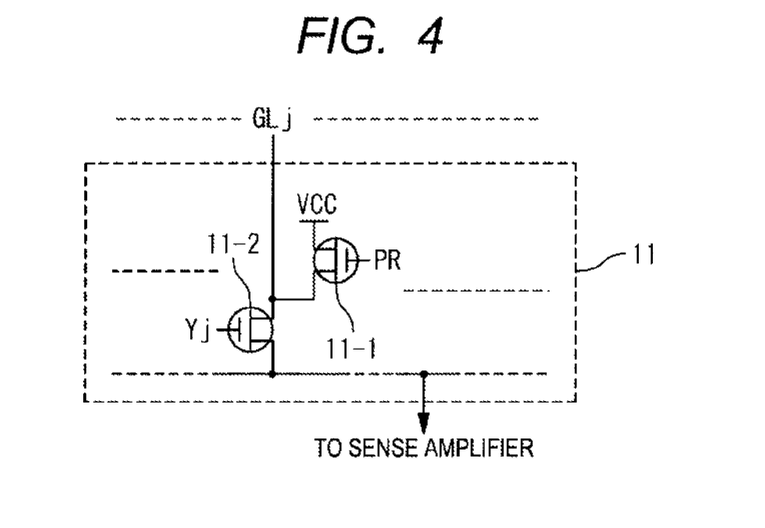
FIG. 4 is a circuit diagram illustrating an example of the configuration of a precharge circuit/Y switch of a semiconductor memory device in an embodiment of the invention.

FIG. 4 is a circuit diagram illustrating an example of the configuration of the precharge circuit/Y switch 11. It shows the portion corresponding to the j-th main bit line GL ($1 \leq j \leq 8$ (the number of columns of the memory blocks B), j is a natural number). The main bit line GLj is coupled to power supply voltage VCC through the p-channel transistor 11-1. When a precharge signal PR (low level) is inputted to the gate of the p-channel transistor 11-1, the p-channel transistor 11-1 is turned on and the main bit line GLj is precharged with power supply voltage VCC. Further, the main bit line GLj is coupled to the sense amplifier/data output circuit 12 through the p-channel transistor 11-2. When a main bit line selection signal Yj (low level) is inputted to the gate of the p-channel transistor 11-2, the p-channel transistor 11-2 is turned on and the main bit line GLj is coupled to the sense amplifier.

Figure 5:
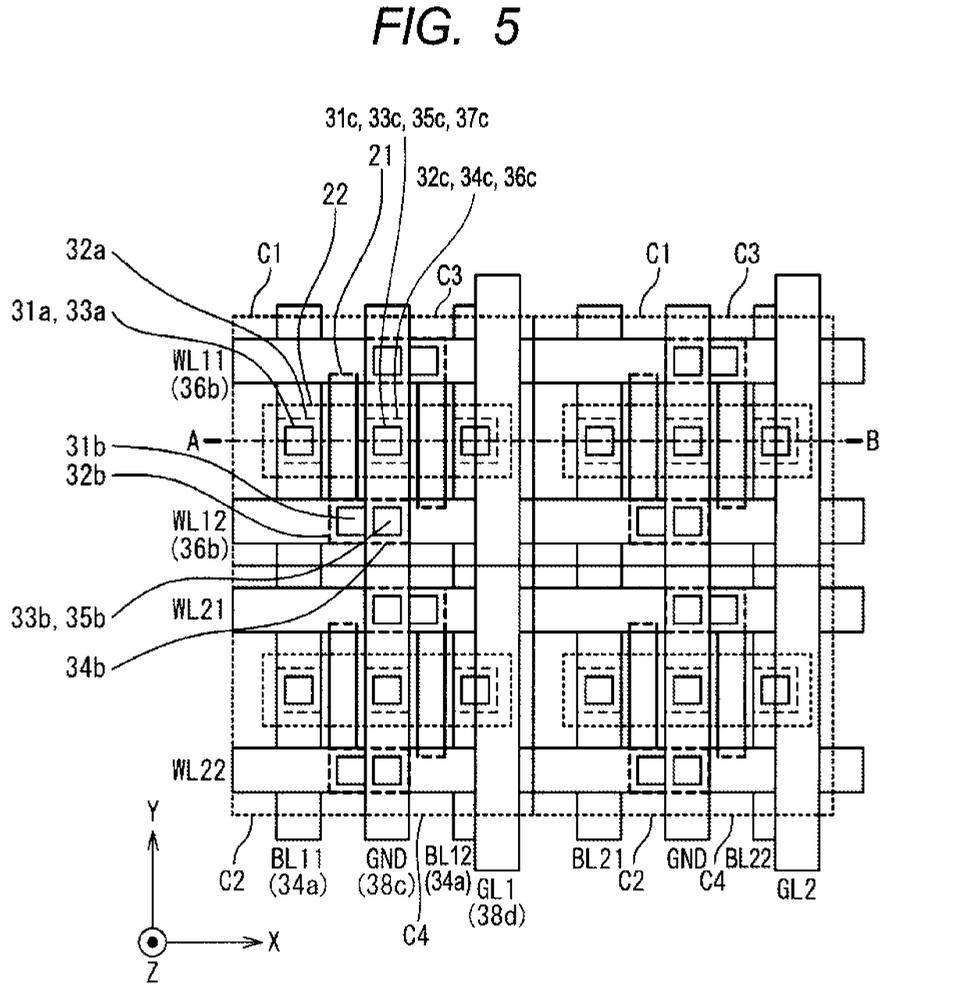
FIG. 5 is a layout diagram illustrating the configuration of a semiconductor memory device in the first embodiment of the invention.
Figure 6:
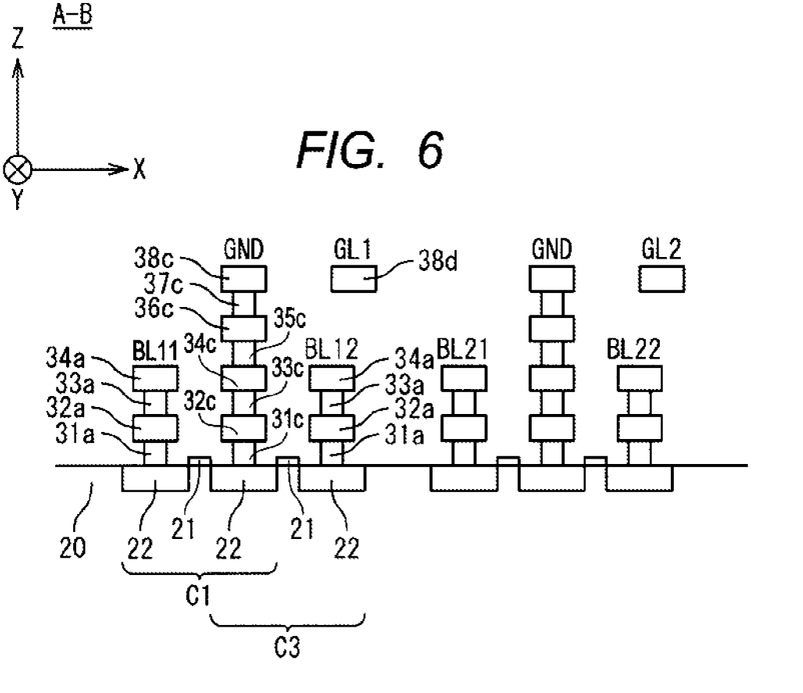
FIG. 6 is a layout diagram illustrating the configuration of a semiconductor memory device in the first embodiment of the invention.

FIG. 5 and FIG. 6 are layout diagrams illustrating the configuration of the semiconductor memory device in the first embodiment of the invention. FIG. 5 is a plan view illustrating an example of the layout of the word lines WL11 to WL22, the sub bit lines BL11 to BL22, the memory cells C1 to C4 located in proximity thereto, and the periphery thereof. FIG. 6 is a sectional view taken along line A-B of FIG. 5.

Description will be given with the memory cell C1 taken as an example. In the area of the memory cell C1, diffusion layers 22 (source/drain) are buried in the surface region of a semiconductor substrate 20. A channel region is formed between the diffusion layers 22 and a gate 21 is provided over the channel region.

One of the diffusion layers 22 (either of source/drain) is coupled to the bit line BL11 (second metal layer 34a) extended in the ±y direction through a contact 31a, a first metal layer 32a, and a first via 33a laminated in the +z direction. The memory cell C1 stores data by the presence or absence of the first via 33a. That is, switching of data in the mask ROM is carried out by the presence or absence of the first via 33a. For example, when there is not the first via 33a (always off), "0" is taken as the data; and when there is the first via 33a, "1" is taken as the data (on at the potential of a word line WL).

The other of the diffusion layers 22 (the other of source/drain) is coupled to a GND line (fourth metal layer 38c) extended in the ±y direction through the following: another contact 31c, first metal layer 32c, first via 33c, second metal layer 34c, a second via 35c, a third metal layer 36c, and a third via 37c laminated in the +z direction.

The gate 21 crosses the diffusion layers 22 in the ±y direction. The gate 21 is coupled to the word line WL12 (third metal layer 36b) extended in the ±x direction at its one end through the following: further another contact 31b, first metal layer 32b, first via 33b, second metal layer 34b, and second via 35b laminated in the +z direction.

The memory cell C3 is provided in a position of rotational symmetry (dyad symmetry or point symmetry) with the central axis of the laminated structure located over the other diffusion layer 22 of the memory cell C1 at the center. (The laminated structure includes the contact 31c, first metal layer 32c, first via 33c, second metal layer 34c, second via 35c, third metal layer 36c, and third via 37c.) The main bit line GL1 (fourth metal layer 38d) is extended in the ±y direction and is provided above the sub bit line BL12 (second metal layer 34a).

The memory cell C2 and the memory cell C4 are respectively the same as the memory cell C1 and the memory cell C3.

In this embodiment, the GND line is laid out so that it is orthogonal to the word lines WL11, WL12, . . . . As a result, the word lines WL11, WL12, WL21, WL22, . . . equivalent to twice the word lines WL1, WL2, . . . in conventional cases (FIG. 1) can be laid out in an identical wiring layer.

Figure 7:
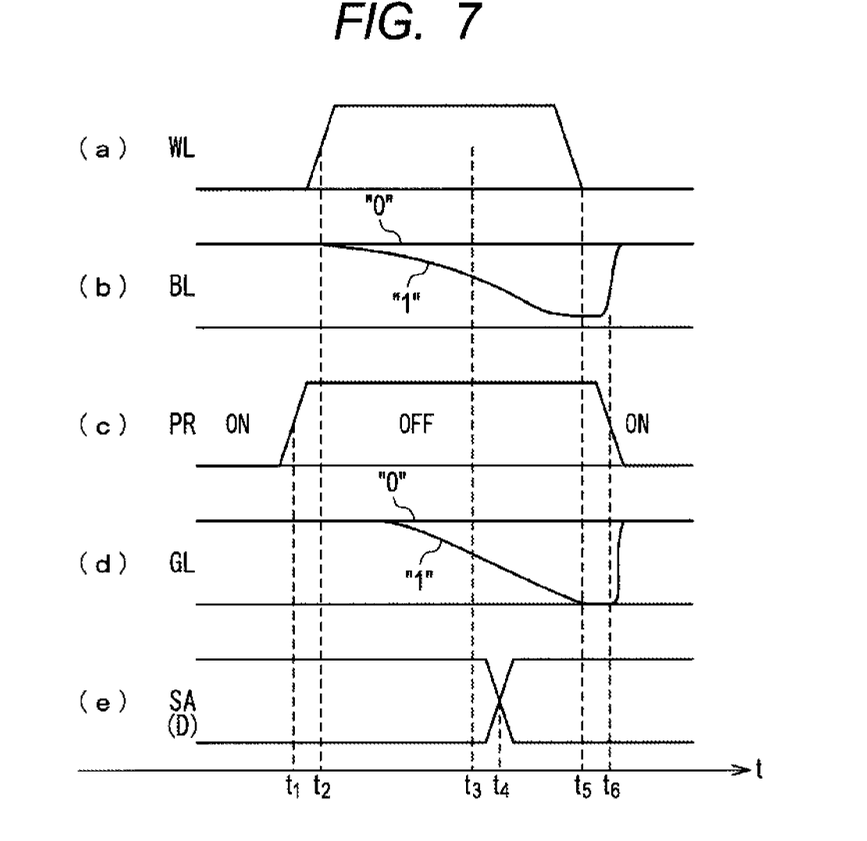
FIG. 7A is a timing chart indicating the operation of a semiconductor memory device in an embodiment of the invention.
FIG. 7B is a timing chart indicating the operation of the semiconductor memory device in the above embodiment of the invention.
FIG. 7C is a timing chart indicating the operation of the semiconductor memory device in the above embodiment of the invention.
FIG. 7D is a timing chart indicating the operation of the semiconductor memory device in the above embodiment of the invention.
FIG. 7E is a timing chart indicating the operation of the semiconductor memory device in the above embodiment of the invention.

Description will be given to the operation of the semiconductor memory device in the first embodiment of the invention. FIGS. 7A to 7E are timing charts showing the operation of the semiconductor memory device in the first embodiment of the invention. FIG. 7A indicates the potential of a word line WL selected by the X decoder 3 and the WL driver 4. FIG. 7B indicates the potential of a sub bit line BL selected by the BS driver 5 and the switch circuit SC. FIG. 7C indicates the potential of a precharge signal PR inputted to the gate of the p-channel transistor 11-1 of the precharge circuit/Y switch 11. FIG. 7D indicates the potential of a main bit line GL selected by the precharge circuit/Y switch 11. FIG. 7E indicates the potential of the output of the sense amplifier (or the data output circuit) of the sense amplifier/data output circuit 12.

In the following description, the operation of reading data from the memory cell C3 will be taken as an example. The memory cell C3 (coupled to the word line WL12 and the sub bit line BL12) is located in the first row and the second column of the memory block B11 (main bit line GL1). Each main bit line GL and each sub bit line BL have already been precharged with power supply voltage VDD.

At time t1, the precharge signal PR transitions from a low level to a high level (time t1 in FIG. 7C). As a result, the p-channel transistor 11-1 of the precharge circuit/Y switch 11 is turned off and precharging of each main bit line GL and each sub bit line BL is terminated. At this time, both the main bit lines GL and the sub bit lines BL have already been brought to a high level (time t1 in FIGS. 7B and 7D).

At time t2, the Y decoder 6 outputs the main bit line selection signal Y1 for selecting the main bit line GL1 to the precharge circuit/Y switch 11 based on the address signals A1-A3, /A1-/A3. The precharge circuit/Y switch 11 couples the main bit line GL1 to the sense amplifier/data output circuit 12. That is, the main bit line GL1 is selected.

The BS driver 5 selects the sub bit line selection line BS12 corresponding to the memory block B11 and the sub bit line BL12 of the memory cell C3 based on the address signals A10-A11, /A10-/A11, A0, /A0. The switch circuit SC1 turns on the p-channel transistor S12 to select the sub bit line BL12.

Further, the WL driver 4 selects the following based on the main word line X1 selected by the X decoder 3 and the address signals A0, /A0: it selects the word line WL12 belonging to the set of word lines WL1 corresponding to the selected main word line X1.

As a result, the potential of the selected word line WL12 is brought to a high level (time t2 in FIG. 7A). Consequently, the gate of the memory cell C3 as the target of read is turned on. In case where data "0" has been inputted to the memory cell C3 at this time, there is not the first via 33a. For this reason, the path running from the sub bit line BL12 to the GND line by way of the transistor of the memory cell C3 is interrupted; therefore, the potential precharged to the sub bit line BL12 is not reduced (the case of "0" in FIG. 7B). As a result, the potential of the main bit line GL1 is not reduced, either (the case of "0" in FIG. 7D). Meanwhile, in cases where data "1" has been inputted to the memory cell C3, there is the first via 33a. For this reason, the path running from the sub bit line BL12 to the GND line by way of the transistor of the memory cell C3; therefore, the potential precharged to the sub bit line BL12 is reduced (the case of "1" in FIG. 7B). As a result, the potential of the main bit line GL1 is also reduced (the case of "1" in FIG. 7D).

In case where data "0" has been inputted to the memory cell C3 at time t3, the potentials of the sub bit line BL12 and the main bit line GL1 are maintained (time t3 in the case of "0" in FIGS. 7B and 7D). As a result, when the sense amplifier is turned on at time t4, the potential of the main bit line GL1 and the potential of the sub bit line BL12 are kept at a high level (time t4 in the case of "0" in FIGS. 7D and 7B).

Consequently, the sense amplifier (or the data output circuit) outputs a potential of "high level" (time t4 in the case of "0" in FIG. 7E).

Meanwhile, in case where data "1" has been inputted to the memory cell C, the potentials of the sub bit line BL12 and the main bit line GL1 are reduced (time t3 in the case of "1" in FIGS. 7B and 7D). As a result, when the sense amplifier is tuned on at time t4, the potentials of the main bit line GL1 and the sub bit line BL12 are brought to a low level (time t4 in the case of "1" in FIGS. 7D and 7B).

Consequently, the sense amplifier (or the data output circuit) outputs a potential of "low level" (time t4 in the case of "1" in FIG. 7E).

At time t5, selection of a word line WL is terminated and the potential of the word line WL that has been selected is brought to a low level (time t5 in FIG. 7A). Consequently, the gate of the memory cell C3 as the target of read is turned off.

At time t6, the precharge signal PR transitions from a high level to a low level (time t6 in FIG. 7C). Further, each switch circuit SC is selected by the BS driver 5 and each p-channel transistor S is turned on. As a result, the p-channel transistor 11-1 of the precharge circuit/Y switch 11 is turned on and precharging of the main bit lines GL and the sub bit lines BL is started.

In case where data "1" in the memory cell C3 is read at this time, the following takes place: since both the main bit line GL1 and the sub bit line BL12 are at a low level, a precharge current is actually passed and precharging is carried out (time t6 in the case of "1" in FIGS. 7D and 7B). Meanwhile, in case where data "0" in the memory cell C3 is read, the following takes place: since both the main bit line GL1 and the sub bit line BL12 are at a high level, a precharge current is actually not passed and precharging is not carried out (time t6 in the case of "0" in FIGS. 7D and 7B).

The semiconductor memory device in this embodiment operates as mentioned above.

In this embodiment, only the following memory cell is turned on at time 6: a memory cell C3 provided over a desired sub bit line BL12 of multiple sub bit lines BL11, BL12 coupled to an identical main bit line GL1 and coupled to a selected word line WL12. That is, the memory cell C1 that is located in the same row as the memory cell C3 but is provided over the other sub bit line B11 and is coupled to the non-selected word line WL11 is not turned on. For this reason, it is possible to prevent the potential (electric charges) precharged in the other sub bit line BL11 from escaping. This makes it unnecessary to pass an unnecessary precharge current through the sub bit line BL11 that was not related to read, in subsequent precharging. As a result, power consumption can be reduced.

This embodiment is different from the conventional technology illustrated in FIG. 1 in that:

Word lines WLi1, WLi2 corresponding to each memory cell C in an identical row are selected by the start address A0 on the Y side (column side) and the complementary signal /A0 thereof. Thus word lines can be selected without separately generating any special address signal.

The memory cells C coupled to the word line WLi1 are coupled to the sub bit lines BLj1 and the memory cells C coupled to the word line WLi2 are coupled to the sub bit lines BLj2. Since word lines WL are provided in correspondence with sub bit lines BL as mentioned above, the following is implemented: it is eliminated to select the memory cells C of multiple sub bit lines BL by one word line WL and thus it is unnecessary to carry out needless discharging and accompanying needless charging.

One main bit line GLj is coupled to a pair of sub bit lines BLj1, BLj2 through a pair of switch transistors (p-channel transistors) Sj1, Sj2. Which of the switch transistor Sj1 or Sj2 to select is determined in correspondence with the selection of a word line WLi1, WLi2. As the result of the adoption of this configuration, only either of a pair of the sub bit lines BLj1, BLj2 is selected. Therefore, the number of selected sub bit lines BL is reduced to a half as compared with conventional cases (FIG. 1). As a result, a charging current after read is reduced to a half of that in conventional cases. That is, power consumption can be reduced as compared with conventional cases.

In the above description of this embodiment, a mask ROM having a predetermined configuration has been taken as an example of the semiconductor memory device. However, the invention is not limited to this example. For example, the following can be variously modified as long as the above-mentioned functions and operation can be carried out: the arrangement of the main memory blocks, the number and arrangement of the memory blocks, and the number and arrangement of the memory cells in each memory block, the number and arrangement of the sub bit lines, and the like. The invention is applicable not only to mask ROMs. It is also similarly applicable to the following semiconductor memory devices and semiconductor integrated circuits incorporating them: semiconductor memory devices in which a memory array is divided into multiple memory blocks, word lines are shared among the memory blocks, and in each memory block, multiple sub bit lines are used to reduce power consumption.

Second Embodiment

Description will be given to a semiconductor memory device in a second embodiment of the invention.

First, description will be given to the configuration of the semiconductor memory device in the second embodiment of the invention. The second embodiment is different from the first embodiment in the layout of the configuration of the semiconductor memory device. Hereafter, description will be given to this layout and with respect to the same configuration (FIG. 2, FIG. 3, FIG. 4) and operation (FIGS. 7A to 7E) as in the first embodiment, the description thereof will be omitted.

Figure 8:
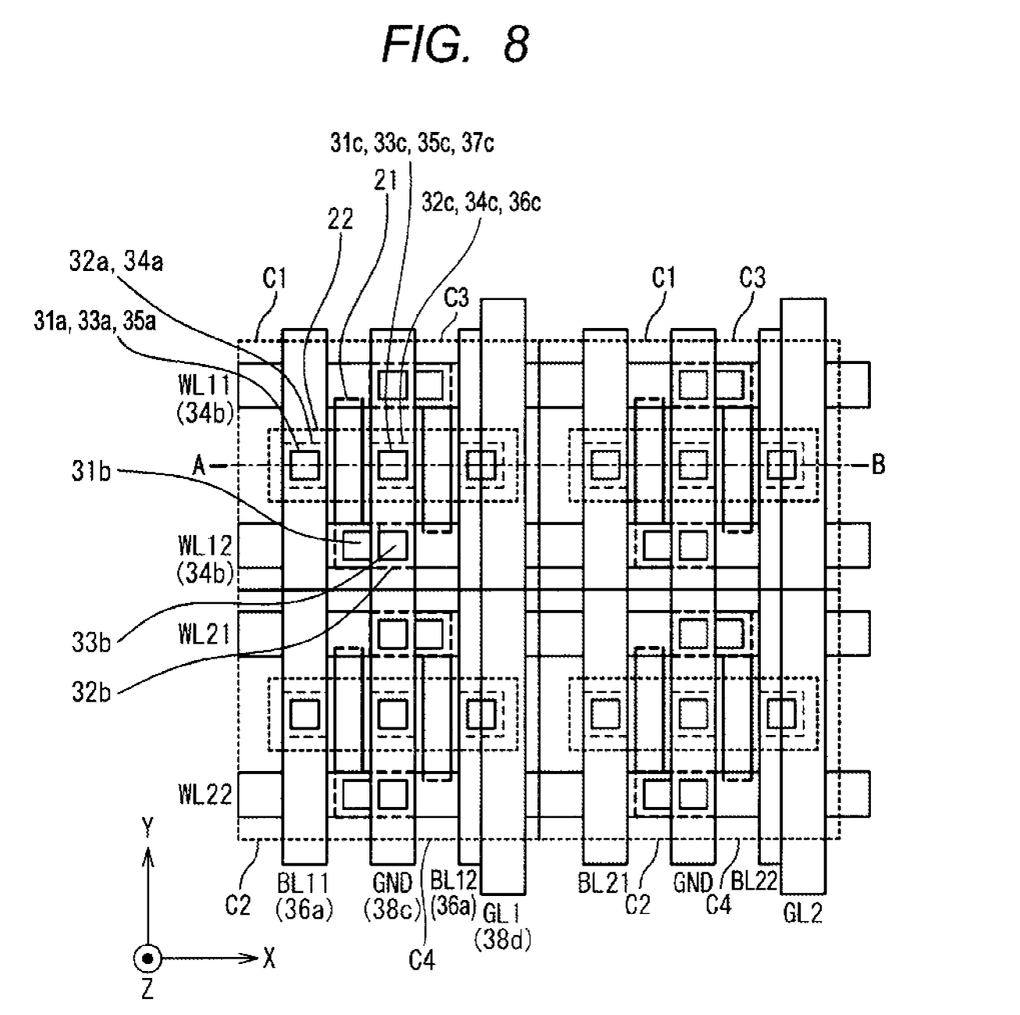
FIG. 8 is a layout diagram illustrating the configuration of a semiconductor memory device in the second embodiment of the invention.
Figure 9:
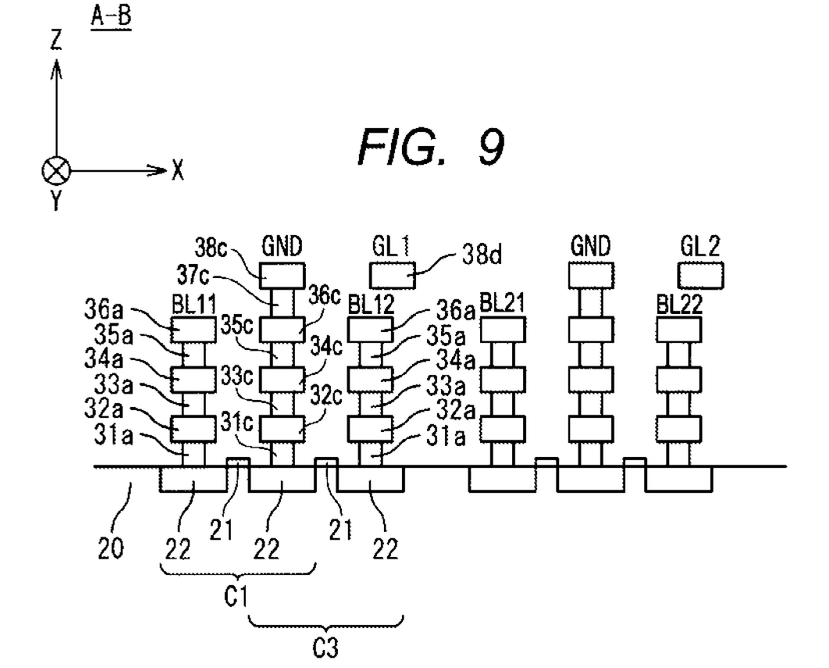
FIG. 9 is a layout diagram illustrating the configuration of the semiconductor memory device in the second embodiment of the invention.

FIG. 8 and FIG. 9 are layout diagrams illustrating the configuration of the semiconductor memory device in the second embodiment of the invention. FIG. 8 is a plan view illustrating an example of the layout of the word lines WL11 to WL22, the sub bit lines BL11 to BL22, the memory cells C1 to C4 located in proximity thereto, and the periphery thereof. FIG. 9 is a sectional view taken along line A-B of FIG. 8. In this embodiment, unlike the first embodiment, the word lines WL11, WL12, . . . are laid out in a second metal layer 34b and the sub bit lines BL11, BL12, . . . are laid out in a third metal layer 36a. Switching of data in the memory cells C (mask ROM) is carried out by the presence or absence of a second via 35a.

Description will be given with the memory cell C1 taken as an example. In the area of the memory cell C1, diffusion layers 22 (source/drain) are buried in the surface region of a semiconductor substrate 20. A channel region is formed between the diffusion layers 22 and a gate 21 is provided over the channel region.

One of the diffusion layers 22 (either of source/drain) is coupled to the bit line BL11 (third metal layer 36a) extended in the ±y direction through the following: a contact 31a, a first metal layer 32a, a first via 33a, a second metal layer 34a, and a second via 35a laminated in the +z direction. The memory cell C1 stores data by the presence or absence of the second via 35a. That is, switching of data in the mask ROM is carried out by the presence or absence of the second via 35a. For example, when there is not the second via 35a (always off), "0" is taken as the data; and when there is the second via 35a (on at the potential of a word line WL), "1" is taken as the data.

The other of the diffusion layers 22 (the other of source/drain) is coupled to a GND line (fourth metal layer 38c) extended in the ±y direction through the following: another contact 31c, first metal layer 32c, first via 33c, second metal layer 34c, second via 35c, third metal layer 36c, and third via 37c laminated in the +z direction.

The gate 21 crosses the diffusion layers 22 in the ±y direction. The gate 21 is coupled to the word line WL12 (second metal layer 34b) extended in the ±x direction at its one end through the following: further another contact 31b, first metal layer 32b, and first via 33b.

The memory cell C3 is provided in a position of rotational symmetry (dyad symmetry or point symmetry) with the central axis of the laminated structure located over the other diffusion layer 22 of the memory cell C1 at the center. (The laminated structure includes the contact 31c, first metal layer 32c, first via 33c, second metal layer 34c, second via 35c, third metal layer 36c, and third via layer 37c). The main bit line GL1 (fourth metal layer 38d) is extended in the ±y direction and is provided above the sub bit line BL12 (third metal layer 36a).

The memory cell C2 and the memory cell C4 are respectively the same as the memory cell C1 and the memory cell C3.

In this embodiment, the same effect as in the first embodiment can be obtained even when wiring layers in which the word lines WL and the sub bit lines BL are laid out are changed.

Third Embodiment

Description will be given to a semiconductor memory device in a third embodiment of the invention.

First, description will be given to the configuration of the semiconductor memory device in the third embodiment of the invention. The third embodiment is different from the first embodiment in the configuration of the sub bit lines in the semiconductor memory device. More specific description will be given. In this embodiment, each adjoining sub bit lines are used in a shared manner. Hereafter, description will be given to the configuration of the sub bit lines and with respect to the same configurational elements (part of FIG. 2, FIG. 3, and FIG. 4) and operation (FIGS. 7A to 7E) as in the first embodiment, the description thereof will be omitted.

Figure 10:
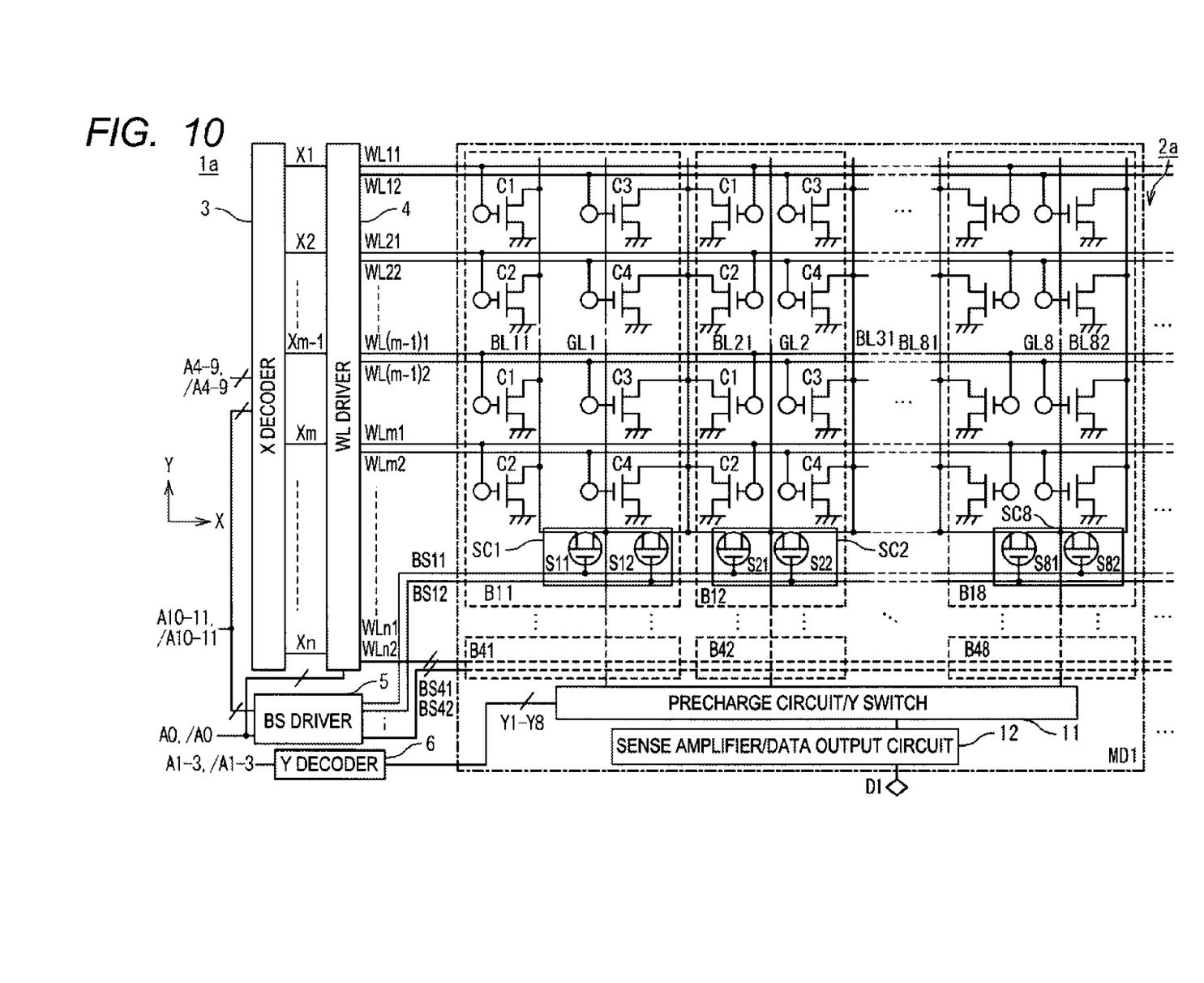
FIG. 10 is a block diagram illustrating the configuration of a semiconductor memory device in a third embodiment of the invention.

FIG. 10 is a block diagram illustrating the configuration of the semiconductor memory device in the third embodiment of the invention. This semiconductor memory device 1 includes a memory array 2, an X decoder 3, a WL driver 4, a BS driver 5, and a Y decoder 6. The X decoder 3, WL driver 4, BS driver 5, and Y decoder 6 are the same as those in the first embodiment and the description thereof will be omitted.

The memory array 2 includes multiple main memory blocks MD1 to MDp adjoining to one another in the Y direction. (However, only the main memory block MD1 is shown in the drawing.) The main memory blocks MD1 to MDp correspond to outputs D1 to Dp. Each of the main memory blocks MD1 to MDp includes multiple memory blocks B, multiple main bit lines GL, a precharge circuit/Y switch 11, and a sense amplifier/data output circuit 12. The main bit lines GL, precharge circuit/Y switch 11, and sense amplifier/data output circuit 12 are the same as those in the first embodiment and the description thereof will be omitted.

The memory blocks B are provided in a matrix configuration. This drawing shows an example in which they are provided in a matrix with four rows and eight columns, that is, the memory blocks B11, B12, ..., B18, B21, ..., B28, ..., B41, ..., B48 are provided. However, the invention is not limited to this example. The individual memory blocks B are identical in configuration. Each of the memory blocks B includes multiple memory cells C, multiple sub bit lines BL, multiple word lines WL, and a switch circuit SC. The memory cells C, word lines WL, and switch circuit SC are the same as those in the first embodiment and the description thereof will be omitted.

The multiple sub bit lines BL are extended in the Y direction and their one ends are coupled to a switch circuit SCj. This drawing illustrates an example in which two sub bit lines, that is, the sub bit lines BL11, BL12=BL21 are provided. The sub bit lines BL are provided in correspondence with the columns of the memory cells C (on a column-by-column basis). In this embodiment, the following are common: the sub bit line BLj2 closest to the adjacent memory block Bh(j+1) of the multiple sub bit lines BLj1, BLj2 in each memory block Bhj (1≦h≦8 (the number of rows of the memory blocks B), h is a natural number); and the sub bit line BL(j+1)1 closest to the adjacent memory block Bhj of the multiple sub bit lines BL(j+1)1, B(j+1)2 of the adjacent memory block Bh(j+1). That is, an identical sub bit line is used in a shared manner. For example, the following sub bit lines are common: the sub bit line BL12 closest to the adjacent memory block B12 of the multiple sub bit lines BL11, BL12 of the memory block B11; and the sub bit line BL21 closest to the adjacent memory block B11 of the multiple sub bit lines BL21, BL22 of the adjacent memory block B12. That is, the sub bit line BL12=the sub bit line BL21.

Figure 11:
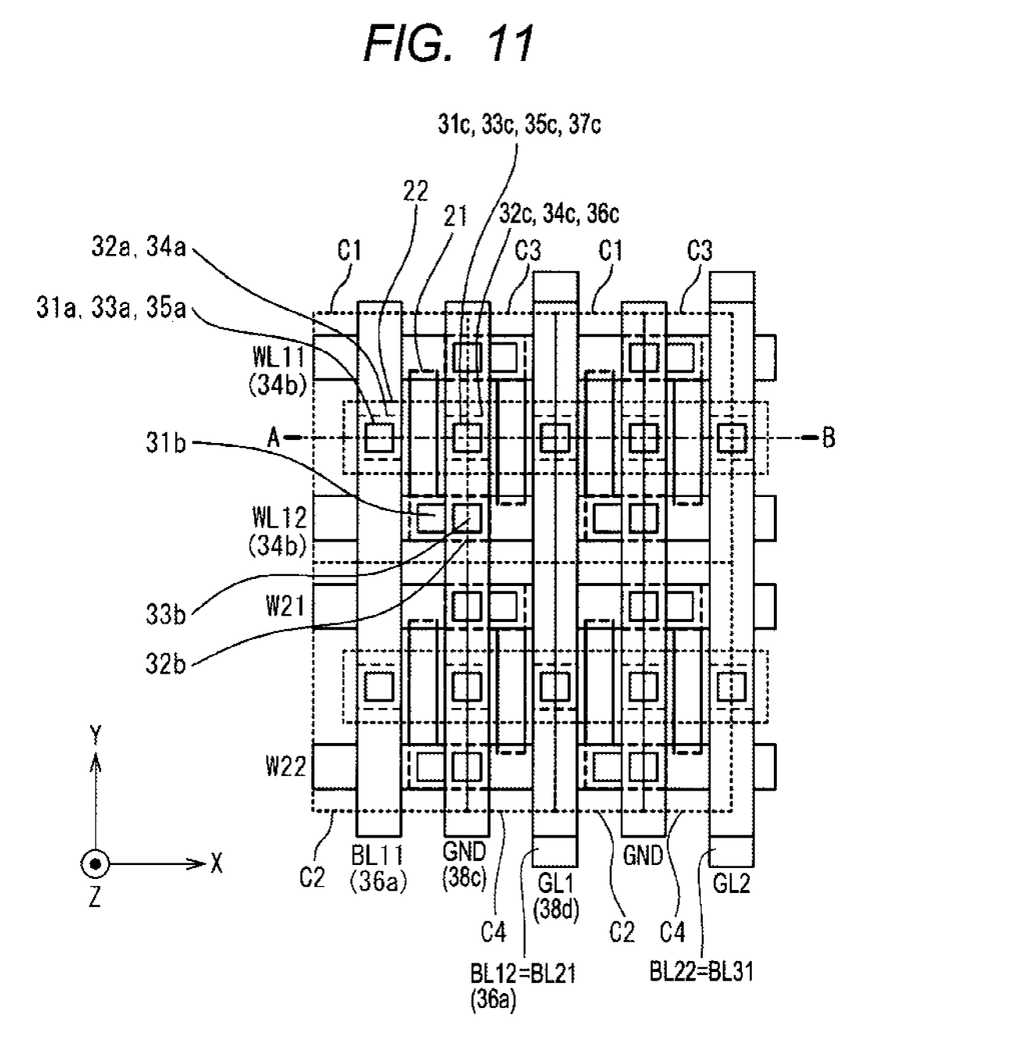
FIG. 11 is a layout diagram illustrating the configuration of the semiconductor memory device in the third embodiment of the invention.
Figure 12:
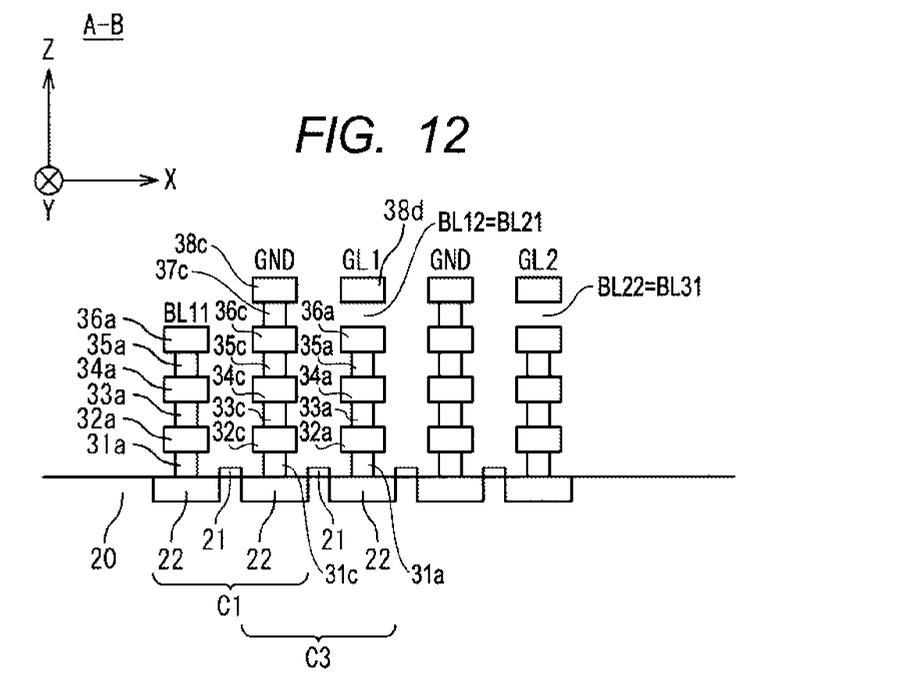
FIG. 12 is a layout diagram illustrating the configuration of the semiconductor memory device in the third embodiment of the invention.

FIG. 11 and FIG. 12 are layout diagrams illustrating the configuration of the semiconductor memory device in the third embodiment of the invention. FIG. 11 is a plan view illustrating an example of the layout of the word lines WL11 to WL22, the sub bit lines BL11, BL12=BL21, BL22=BL31, the memory cells C1 to C4 located in proximity thereto, and the periphery thereof. FIG. 12 is a sectional view taken along line A-B of FIG. 11.

Description will be given with the memory cell C1 taken as an example. In the area of the memory cell C1, diffusion layers 22 (source/drain) are buried in the surface region of a semiconductor substrate 20. A channel region is formed between the diffusion layers 22 and a gate 21 is provided over the channel region.

One of the diffusion layers 22 (either of source/drain) is coupled to the bit line BL11 (third metal layer 36a) extended in the ±y direction through the following: a contact 31a, a first metal layer 32a, a first via 33a, a second metal layer 34a, and a second via 35a laminated in the +z direction.

The other of the diffusion layers 22 (the other of source/drain) is coupled to a GND line (fourth metal layer 38c) extended in the ±y direction through the following: another contact 31c, first metal layer 32c, first via 33c, second metal layer 34c, second via 35c, third metal layer 36c, and third via 37c laminated in the +z direction.

The gate 21 crosses the diffusion layers 22 in the ±y direction. The gate 21 is coupled to the word line WL12 (second metal layer 34b) extended in the ±x direction at its one end through the following: further another contact 31b, first metal layer 32b, and first via 33b. The memory cell C1 stores data by the shape of the first metal layer 32b and the presence or absence of the first via 33b. That is, switching of data of the mask ROM is carried out by the shape of the first metal layer 32b and the presence or absence of the first via 33b. For the example, in the cases where the following is implemented, "0" is taken as the data (the gate 21 is grounded to the GND line and is not coupled with a word line WL: always off): the first metal layer 32b is extended from above the contact 31b (by way of a position located under the first metal layer 32b) so that it is coupled with the first metal layer 32c over the other diffusion layer 22; and there is not the first via 33b. Meanwhile, when the shape of the first metal layer 32b is such that it couples together the area located above the contact 31b and the area located under the first via 33b, "1" is taken as the data (the gate 21 is coupled with a word line WL: on at the potential of a word line WL).

The memory cell C3 is provided in a position of rotational symmetry (dyad symmetry or point symmetry) with the central axis of the laminated structure located over the other diffusion layer 22 of the memory cell C1 at the center. (The laminated structure includes the contact 31c, first metal layer 32c, first via 33c, second metal layer 34c, second via 35c, third metal layer 36c, and third via 37c.) The main bit line GL1 (fourth metal layer 38d) is extended in the ±y direction and is provided above the sub bit line BL12=BL21 (third metal layer 36a).

The memory cell C2 and the memory cell C4 are respectively the same as the memory cell C1 and the memory cell C3.

According to this embodiment, the same effect as according to the first embodiment can be obtained.

In this embodiment, in addition, the sets of adjoining sub bit lines BL, BL12 and BL21, BL21 and BL31, ..., BL72 and BL81 are respectively used in a shared manner as illustrated in FIG. 10 to FIG. 12. In this embodiment, as mentioned above, the sub bit lines BLj1 and BLj2 are not simultaneously selected and thus the above mentioned use in a shared manner can be implemented. It is seen from the comparison of FIG. 11 with FIG. 5 or FIG. 8: use of the configuration of this embodiment in which adjacent sub bit lines BL are used in a shared manner significantly reduces the cell area. That is, the area of the semiconductor memory device can be reduced.

The invention is not limited to the above-mentioned embodiments and it is apparent that each embodiment can be transformed or modified within the scope of the technical idea of the invention. The technologies of the individual embodiments can be combined and used as long as they do not technically conflict with each other.

What is claimed is:

1. A semiconductor memory device comprising:
   a plurality of memory blocks provided in a matrix configuration; and
   a plurality of main bit lines provided in correspondence with the memory blocks,
   wherein each of the memory blocks includes:
      a plurality of memory cells provided in a matrix configuration;
      a plurality of sub bit lines provided on a column-by-column basis;
      a plurality of word lines provided with respect to each of the columns and the rows and common to the memory blocks, wherein each of the memory cells in the memory block is provided with an independent word line; and
   a switch circuit that couples a corresponding main bit line of the main bit lines to any of the sub bit lines, and
   wherein in the operation of reading a target cell as the target of read among the memory cells,
   a main bit line corresponding to the target cell is selected,
   a sub bit line corresponding to the column of the target cell is selected through the switch circuit, and
   a word line corresponding to the column and the row of the target cell is selected from among the word lines.

2. The semiconductor memory device according to claim 1, wherein in a first memory block and a second memory block adjacent to each other of the memory blocks, the first sub bit line on the second memory block side of the sub bit lines in the first memory block and the second sub bit line on the first memory block side of the sub bit lines in the second memory block are formed as a common sub bit line.

3. The semiconductor memory device according to claim 1, wherein each of the memory cells is a ROM cell.

4. The semiconductor memory device according to claim 3, wherein the ROM cell includes a transistor and a data switching portion,
wherein the transistor has the gate coupled to a word line corresponding to the ROM cell and has either of the source/drain coupled to a sub bit line corresponding to the ROM cell and the other of the source/drain coupled to a first power source, and
wherein the data switching portion has any of three points of coupling of the transistor interrupted or grounded depending on data stored in the ROM cell.

5. The semiconductor memory device according to claim 4, wherein the data switching portion is comprised of a contact or a via or a wiring and the presence or absence of the contact or the via or the wiring is set when a mask is fabricated.

6. The semiconductor memory device according to claim 1, wherein the sub bit lines are formed in a first wiring layer, wherein the word lines are formed in a second wiring layer, and
wherein a plurality of ground lines coupled to the main bit lines and the memory cells are formed in a third wiring layer.

7. The semiconductor memory device according to claim 6, wherein the word lines and the ground lines are arranged so that the word lines and the ground lines are orthogonal to each other.

8. The semiconductor memory device according to claim 3, wherein the switch circuit is comprised of a transistor of a conductivity type opposite the conductivity type of the transistor comprising the ROM cell.

9. A method of operation of a semiconductor memory device,
wherein the semiconductor memory device includes:
a plurality of memory blocks provided in a matrix configuration; and
a plurality of main bit line provided in correspondence with the memory blocks,
wherein each of the memory blocks includes:
a plurality of memory cells provided in a matrix configuration;
a plurality of sub bit lines provided on a column-by-column basis;
a plurality of word lines provided with respect to each of the columns and the rows and common to the memory blocks, wherein each of the memory cells in the memory block is provided with an independent word line; and
a switch circuit that couples a corresponding main bit line of the main bit lines to any of the sub bit lines, the method of operation of the semiconductor memory device comprising the steps of:
in the operation of reading a target cell as the target of read of the memory cells, selecting a main bit line corresponding to the target cell;
selecting a sub bit line corresponding to the column of the target cell through the switch circuit; and
selecting a word line corresponding to the column and the row of the target cell from among the word lines.

* * * * *